United States Patent [19]
Leussler

[11] Patent Number: 5,945,826
[45] Date of Patent: Aug. 31, 1999

[54] MR DEVICE WITH A REFERENCE COIL SYSTEM FOR THE RECONSTRUCTION OF MR IMAGES FROM A COIL ARRAY

[75] Inventor: Christoph Leussler, Hamburg, Germany

[73] Assignee: U.S. Philips Corporation, New York, N.Y.

[21] Appl. No.: 08/914,446

[22] Filed: Aug. 19, 1997

[30] Foreign Application Priority Data

Aug. 28, 1996 [DE] Germany ............... 196 34 731

[51] Int. Cl.$^6$ ............................................. G01V 3/00
[52] U.S. Cl. ............................................. 324/309; 324/318
[58] Field of Search ............................. 324/307, 309, 324/300, 312, 318, 322

[56] References Cited

U.S. PATENT DOCUMENTS

| | | |
|---|---|---|
| 4,623,843 | 11/1986 | Macovski ............................. 324/309 |
| 4,685,468 | 8/1987 | Macovski ............................. 324/309 |
| 5,457,386 | 10/1995 | Matsunaga et al. .................. 324/318 |
| 5,600,244 | 2/1997 | Jensen et al. ........................ 324/309 |

FOREIGN PATENT DOCUMENTS

| | | | |
|---|---|---|---|
| 0412824A2 | 2/1991 | European Pat. Off. | ....... G01R 33/54 |
| 0695947A1 | 2/1996 | European Pat. Off. | ..... G01R 33/341 |

*Primary Examiner*—Louis Arana
*Attorney, Agent, or Firm*—Dwight H. Renfrew, Jr.

[57] ABSTRACT

In an MR device in which an MR image can be reconstructed by means of a coil array system, the image data supplied by the coil array system are corrected by means of a reference coil system which consists of a number of coil elements distributed on its circumference. The two coil systems can thus receive MR signals simultaneously.

12 Claims, 2 Drawing Sheets

MR DEVICE WITH A REFERENCE COIL SYSTEM FOR THE RECONSTRUCTION OF MR IMAGES FROM A COIL ARRAY

BACKGROUND OF THE INVENTION

1. Field of the Invention

The invention relates to an MR device, including a) a magnetic field device for generating a uniform, steady magnetic field in an examination zone, b) an RF system for generating magnetic RF pulses in the examination zone, c) a reference coil system for receiving MR signals from an object present in the examination zone, d) a processing unit for forming MR images from the image data, derived from the MR signals of the coil elements of a array coil system, while taking into account reference data derived from the MR signals of the reference coil system.

2. Description of Related Art

An MR device of this kind is known from EP-A-0 695 947 which corresponds to U.S. Pat. No. 5,600,244. A coil array system described therein is available from Philips Medical systems under the trademark "SYNERGY". The coil elements of the coil array system (usually surface coils) receive the MR signals from the object areas in the vicinity of the coils with an improved signal-to-noise ratio (in comparison with a whole-body coil). However, the sensitivity of the individual coil elements is highly location-dependent; the sensitivity is also dependent on the position of the individual coil elements in relation to the object to be examined (the location-dependent sensitivity of an MR coil is defined as the quotient of the magnetic induction in a location and the current in the coil which causes this magnetic induction at this location). Therefore, the data generated by the coil array system must be corrected so as to compensate for the location-dependent differences in sensitivity.

In the known device this correction is performed by means of the reference coil system which is constructed as a whole-body coil and whose sensitivity is substantially independent of location and also independent of the object present in the examination zone. Using the reference data derived from the MR signals received by the reference coil system, the image data supplied by the coil elements of the coil array system are corrected so that an MR image can be reconstructed which reproduces the object to be examined with an enhanced signal-to-noise ratio and a locally more uniform sensitivity.

It is a drawback of the known MR device that the measurements by means of the coil array system on the one hand and the reference coil system on the other hand must be performed separately in time, because an inductive coupling exists between these two coil systems; this inductive coupling has a significant effect on the signal-to-noise ratio of the MR signals received. The measuring period during which the two coil systems acquire the MR signals is thus prolonged.

SUMMARY OF THE INVENTION

It is an object of the present invention to construct an MR device in such a manner that the reference coil system and the coil array system can acquire the MR signals simultaneously, without the signal-to-noise ratio being significantly affected.

This object is achieved according to the invention in that the reference coil system includes at least four coil elements which are mutually offset and grouped around the examination zone in a cross-section perpendicular to the direction of the uniform, steady magnetic field, and that the coil elements have dimensions and a construction such that only insignificant inductive coupling occurs between the coil array system and the reference coil system.

Thus, in accordance with the invention the reference coil system does not consist of a single coil enclosing the entire examination zone as in the known device, but of at least four coil elements which are grouped around the examination zone. Use is made of the fact that the coupling between the reference coil system and the coil array system is less as the surface area of the coil elements of the reference coil system is smaller; this is because the inductive coupling between a reference coil system consisting of a large number of small coil elements and the coil array system is substantially less than in the case of a reference coil system consisting of a single, large coil. Moreover, the inductive coupling can be reduced via the design of the individual coil elements of the reference coil system, i.e. by a suitable choice of the type of coil.

In an embodiment which is attractive in this respect the coil elements of the coil array system on the one hand and the reference coil system on the other hand are constructed so that they are capable of receiving or generating 90° offset magnetic fields. Suitable decoupling can thus be achieved between the two coil systems even when using a smaller number of coil elements in the reference coil system. In a further embodiment the coil elements of the reference coil system are of the butterfly type, it being assumed that the coil elements of the coil array system are surface coils which, as is known, generate and receive magnetic fields perpendicularly to the coil plane or are sensitive to such magnetic fields. Coil elements of the butterfly type, however, generate magnetic fields which extend parallel to the coil plane. It would in principle also be possible to construct the synergy coil system by using coil elements of the butterfly type and the reference coil system by using surface coils.

The coil elements of the reference coil system in a further embodiment of the invention are arranged so as to be uniformly distributed on the surface of a cylinder whose axis extends parallel to the direction of the main magnetic field. A uniform distribution of the coil elements on the surface of a cylinder is advantageous, but not required in all cases. For example, it is feasible to omit coil elements in some locations on the cylinder surface or to arrange the coil elements on differently shaped surfaces.

It would in principle be possible to process the MR signals received by the individual coil elements of the reference coil system in separate digital channels; however, this would require substantial means. Therefore, a further embodiment is provided with a combination circuit for combining the MR signals received by the individual coil elements of the reference coil system. Only a single digital processing channel is then required for the output signal of the (analog) combination circuit. In a further embodiment a respective adjustable phase shifter is operative between the coil elements of the reference coil system and the combination circuit which operates as an adder circuit. Combination of the output signals of the individual coil elements with the correct phase yields a signal wherefrom a reference image can be derived as it would be obtained by means of a single, large reference coil. The reference data of this image can be used to correct the image data derived from the MR signals of the individual coil elements.

In a further embodiment of the invention, each of the coil elements of the reference coil system is coupled to a respective preamplifier via a respective transformation circuit which is proportioned so that the impedance transformed in the current circuit of the coil element is higher than the impedance of the coil element. As a result, the alternating currents flowing in the individual coil elements upon reception of MR signals are reduced, so that the interaction with the coil elements, notably of the coil array system, is also reduced.

It is also possible to provide an existing MR apparatus with a reference coil system according to the invention, it being assumed that an MR apparatus is concerned which includes a processing unit for the formation of MR images from the image data derived from the MR signals of the coil elements of a coil array system, taking into account reference data derived from the MR signals of the reference coil system. Such a reference coil system is characterized in that it includes at least four coil elements which are offset and grouped around the examination zone in a cross-section perpendicular to the direction of the uniform, steady magnetic field, and that the coil elements have dimensions and a design such that only a slight inductive coupling occurs between the coil array system and the reference coil system.

BRIEF DESCRIPTION OF THE DRAWINGS

The invention will be described in detail hereinafter with reference to the drawings. Therein.

DETAILED DESCRIPTION OF THE PREFERRED EMBODIMENTS

Figure 1:
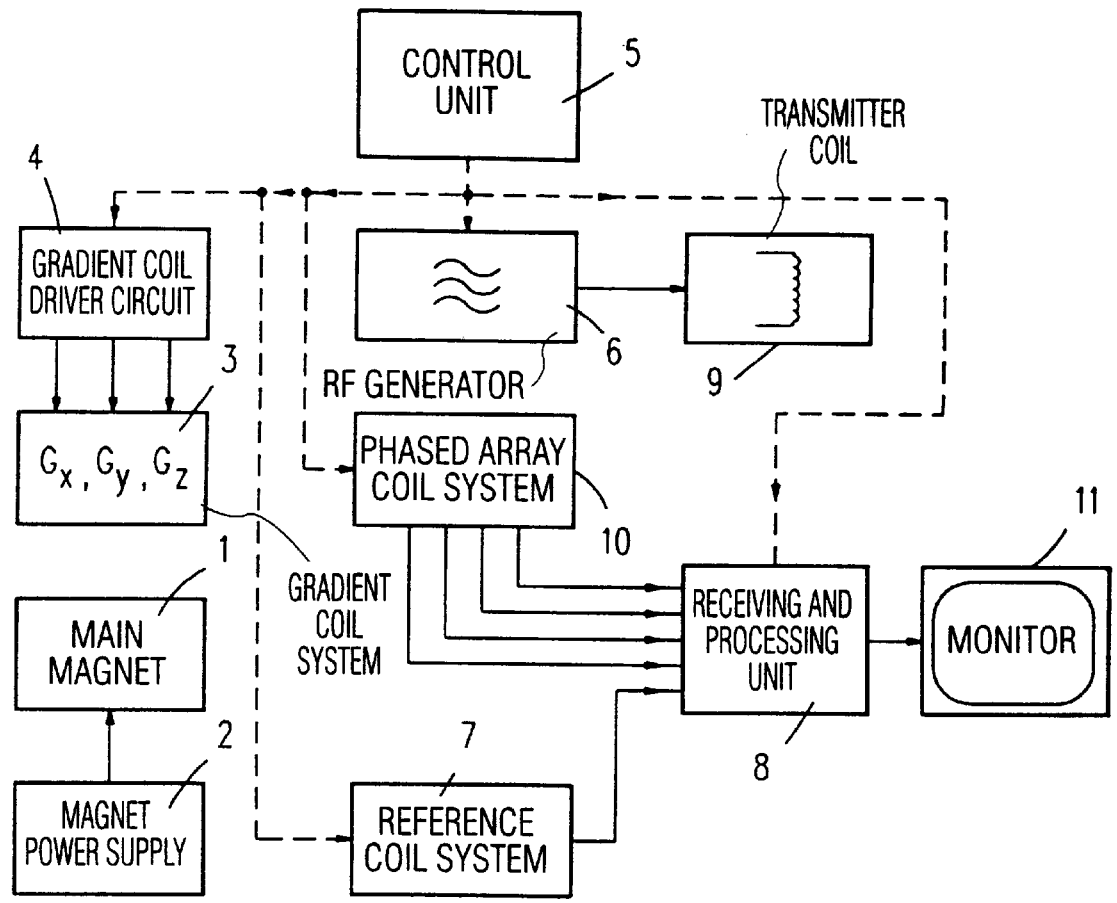
FIG. 1 shows the block diagram of an MR device in which the invention can be used.

The reference numeral 1 in the block diagram of FIG. 1 denotes a preferably superconducting main magnet which generates a steady, uniform magnetic field in an examination zone in which a patient (the object to be examined) may be present. The current required for this purpose is supplied by a power supply unit 2. The reference numeral 3 denotes a gradient coil system which is capable of generating a magnetic gradient field which extends in the direction of the steady magnetic field and whose gradient can extend in the same direction, in two directions perpendicular thereto and perpendicular to one another, or in the direction of a vector which results from a combination of these gradient fields. The currents required for this purpose are supplied by a driver circuit 4, the variation in time of the currents being controlled by a control unit 5 which can be implemented by means of a suitable processor and which also controls the other components of the MR apparatus.

There is also provided an RF generator 6 capable of pulsed generation of an alternating current having the Larmor frequency of the spin system. These currents are applied to a transmitter coil 9 which is shown in a cross-section taken perpendicularly to the direction of the uniform, steady magnetic field in FIG. 2. The transmitter coil 9 may be, for example a bird-cage type coil and generates an RF magnetic field perpendicularly to the uniform, steady magnetic field in the examination zone. The conductors of this transmitter coil extend perpendicularly to this cross-section or to the plane of drawing of FIG. 2, so that they are shown merely as dots therein.

The transmitter coil 9 encloses a reference coil system 70 which is composed of a number of coil elements which are uniformly distributed across the circumference of a circular cylinder. The individual coil elements are of the butterfly type; one such element is shown in FIG. 3. Such a coil element has two wings with the conductors L1, L2 and L3, L4, respectively, the current through the centrally situated conductors L2 and L3 flowing in the same direction. Consequently, the currents in the two wings flow in opposite directions so that the magnetic field component thus generated perpendicularly to one wing has a direction opposing that of the magnetic field component generated perpendicularly to the other wing. These two magnetic field components, therefore, compensate one another at some distance from the relevant coil element, so that only the magnetic field components remain which extend perpendicularly to the conductors L1 . . . L4 (and hence parallel to the plane of drawing in FIG. 2 in which the conductors of the coil elements of the reference coil system are denoted by current arrows $-_x$ and $_o-$). The reference coil element, therefore, can generate or receive only magnetic field components which extend perpendicularly to the direction of the conductors L1 . . . L4. At least four coil elements are required. The number of coil elements (or their dimensions in the circumferential direction) is dependent on the distance from the coil array system; the smaller the distance between the coil elements of the two coils, the more or the smaller coil elements will be required. A suitable value is obtained if the signal-to-noise ratio of the signals supplied by the coil array system decreases by less than 30%, preferably less than 5%, upon simultaneous measurement by means of the two coil systems (in comparison with a measurement by means of the coil array system while the reference coil system is inactive). Only slight inductive coupling then remains between the two coil systems.

The coil elements constituting the reference coil system may consist of tubular conductors. However, they can also be formed simply by etching on a flexible, multilayer substrate provided on the support for the transmitter coil 9. The individual coil elements of the reference coil system are arranged so that they overlap the neighboring coil elements as denoted by the dashed lines in FIG. 3. The degree of overlap is chosen so that neighboring coil elements are decoupled from one another.

Figure 4:
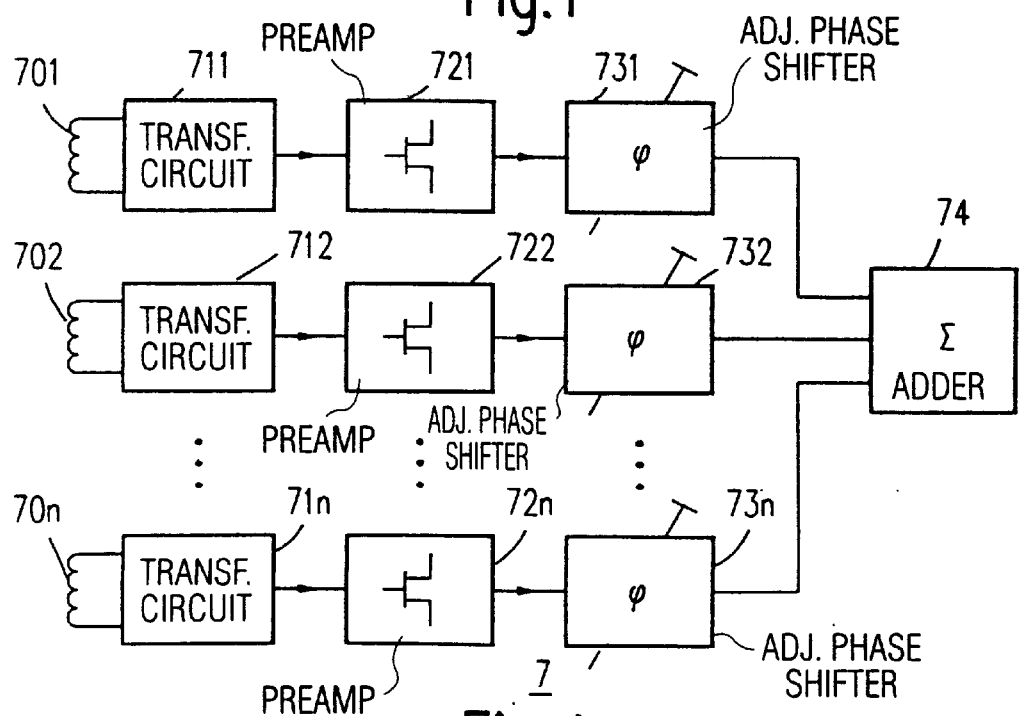
FIG. 4 shows the details of a block of the block diagram shown in FIG. 1.

FIG. 4 shows a block diagram with the coil elements 701, 702 . . . 70n, constituting the reference coil system, and the downstream electronic circuitry. The coil signals are applied to a respective preamplifier 721, 722 . . . 72n via a respective transformation circuit 711, 712 . . . 71n. The transformation circuits can be constructed so that an optimum signal-to-noise ratio is obtained. Preferably, however, the transformation circuits are constructed so that a comparatively high impedance occurs in the current circuit of the coil elements so that the current flowing therein due to an MR signal is reduced, resulting in reduced influencing of the coil array system. Thus, in this case optimization is not aimed at achieving a maximum signal-to-noise ratio, but at achieving a maximum decoupling with a signal-to-noise ratio which still suffices to generate reference data or a reference image. The requirements imposed on such a reference image, however, are not severe, the more so since this image may have a low resolution as is known from the cited document.

The output signals of the preamplifiers 731, 732 . . . 73n are applied, via a respective adjustable or controllable phase shifter 731, 732 . . . 73n, to a common adder circuit 74 whose output signal is proportional to the sum of the input signals. The reference data that can be derived from this output signal, therefore, correspond to the data of a single, large coil which encloses the examination zone and whose sensitivity is substantially independent of the object to be examined which is present in the examination zone. The reference coil system and the electronic circuitry connected thereto in conformity with FIG. 4 are represented by the block 7 in FIG. 1.

Figure 2:
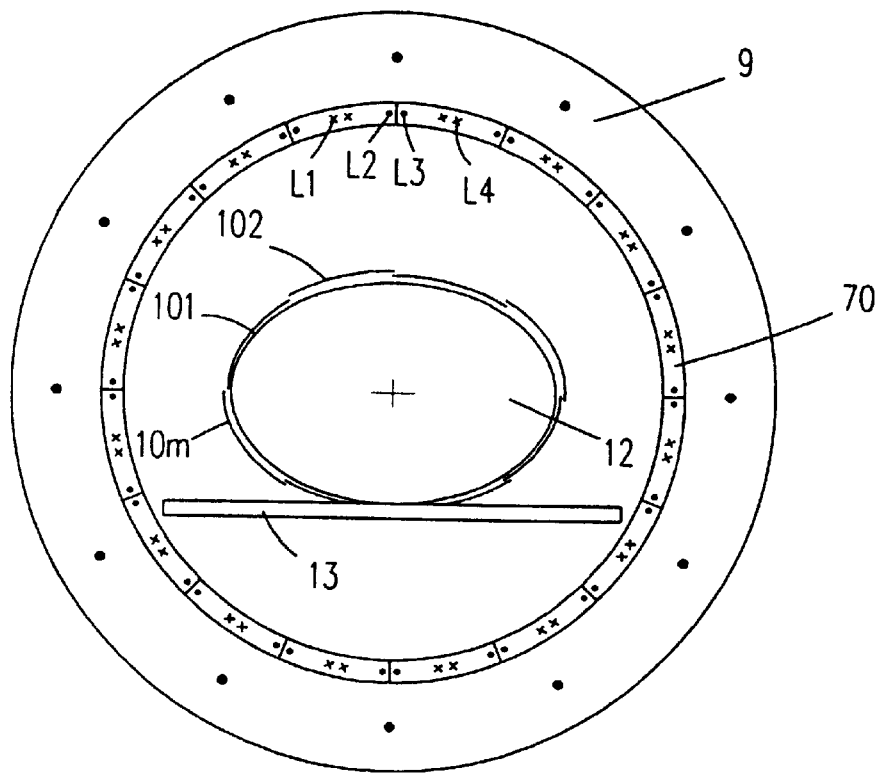
FIG. 2 shows the various coil systems in relation to the object to be examined or the examination zone.
Figure 3:
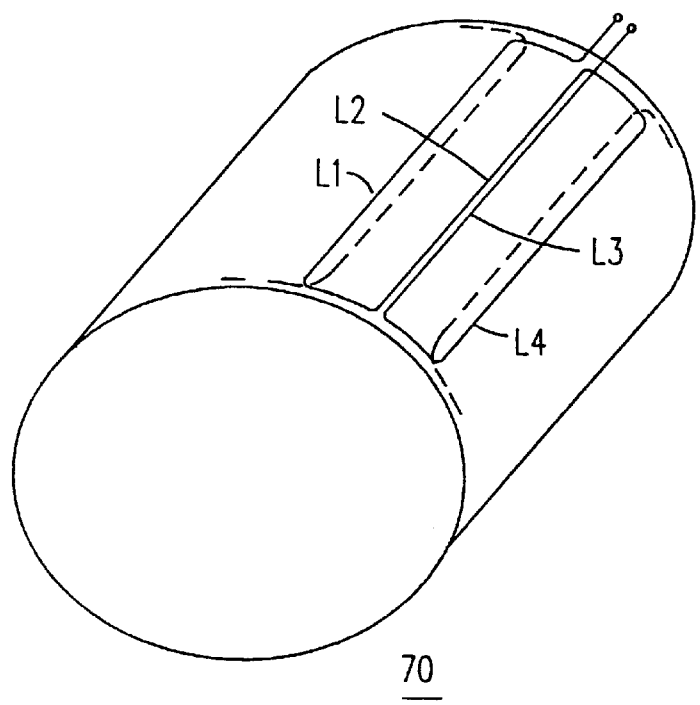
FIG. 3 shows a single coil element of the reference coil system.

As appears from FIG. 2, the examination zone enclosed by the reference coil system contains an object 12 to be examined, for example a patient on a table top 13 whose longitudinal direction extends perpendicularly to the plane of drawing of FIG. 2. Around the patient there is arranged a coil array system 10 which consists of a number of coil elements 101, 102 . . . 10m. These coil elements are surface coils whereby a magnetic field extending perpendicularly to the coil surface can be generated or received. The magnetic fields that can be received or generated by the coil elements of the reference coil system on the one hand and of the coil array system on the other hand thus extend perpendicularly to one another so that the two systems are substantially inductively decoupled from one another. Therefore, MR signals can be received by both coil systems simultaneously, without the signal-to-noise ratio of the MR signals received by the coil elements of the coil array system being significantly degraded.

The signal supplied by the block 7 and the MR signals supplied by the individual coil elements of the coil array system 10 are applied to a receiving and processing unit 8 which comprises, for each coil element of the coil array system 10 as well as for the block 7 with the reference coil system, a respective channel in which the signal is amplified, transposed to a lower frequency range and digitized, and in which image data of an MR image or reference data can be formed from the digitized MR signals.

The correction of the image data by means of the reference data to such an extent that the location-dependent and object-dependent sensitivity of the coil elements of the coil array system does not have an effect on the image quality is described in detail in the cited EP-B 695 947, which corresponds to U.S. Pat. No. 5,600,244, whereto reference is made explicitly herein.

The sensitivity of the coil elements of the reference coil system is also location-dependent to some extent; however, this sensitivity is practically not influenced by the object to be examined. If desired, however, this location-dependency can also be taken into account by means of a calibration method during which, using the reference coil system, an MR image is formed of a preferably homogeneous phantom body arranged in the examination zone. The (reference) data of the MR image thus reconstructed for various points of the examination zone are then directly proportional to the sensitivity of the reference coil system in the relevant point. This sensitivity pattern is stored and used for the correction of the location-dependency of the reference data generated during subsequent MR examinations of an object having an unknown nuclear magnetization distribution.

After correction of the image data of the receiving coils of the coil array system by the (possibly also previously corrected) reference data, the MR image reconstructed therefrom is displayed on a monitor 11.

All references cited herein are incorporated herein by reference in their entirety and for all purposes to the same extent as if each individual publication or patent or patent application was specifically and individually indicated to be incorporated by reference in its entirety for all purposes.

I claim:

1. An MR device comprising:
   a magnet for generating a uniform, steady magnetic field in an examination zone,
   an RF system for generating magnetic RF pulses in the examination zone,
   a coil array system comprising a plurality of coil elements for receiving MR image signals from an object present in the examination zone,
   a reference coil system for receiving MR reference signals from the object, wherein the reference coil system includes at least four coil elements which are mutually offset and grouped around the examination zone in a cross-section perpendicular to the direction of the uniform, steady magnetic field, and the coil elements of the reference coil system have number, dimensions, and construction such that only slight inductive coupling occurs between the coil array system and the reference coil system, and
   a receiving and processing unit for forming an MR image by (i) deriving image data from the MR image signals of coil elements of the coil array system, (ii) deriving reference data from the MR reference signals from the reference coil system, (iii) correcting the derived image data by the derived reference data so that location-dependent sensitivity of the coil elements of the array coil system does not affect image quality, and (iv) deriving the MR image from the corrected image data.

2. An MR device as claimed in claim 1, wherein the coil elements of the reference coil system are of the butterfly type.

3. An MR device as claimed in claim 2, wherein the coil elements of the reference coil system are uniformly distributed on the surface of a cylinder whose axis extends parallel to the direction of the main magnetic field.

4. An MR device as claimed in claim 1, wherein the coil elements of the reference coil system are uniformly distributed on the surface of a cylinder whose axis extends parallel to the direction of the main magnetic field.

5. An MR device as claimed in claim 1, further comprising a combination circuit for combining the MR signals received by the individual coil elements of the reference coil system.

6. An MR device as claimed in claim 5, wherein a respective phase shifter is operative between the coil elements of the reference coil system and the combination circuit which operates as an adder circuit.

7. An MR device as claimed in claim 1, wherein each of the coil elements of the reference coil system is coupled to a respective preamplifier via a respective transformation circuit which is proportioned so that the impedance transformed in the current circuit of the coil elements is higher than the impedance of the coil element.

8. The device of claim 1 wherein the coil elements of the reference coil system have number, dimensions, and construction such that the signal-to-noise ratio of the MR image signals decreases by less than 5% upon simultaneous measurement of the MR image signals and the MR reference signals.

9. The device of claim 1 wherein the receiving and processing unit is further for correcting a location-dependency of the reference data from a stored spatial sensitivity pattern.

10. The device of claim 1 wherein the receiving and processing unit is further for correcting the object-dependent sensitivity of the coil elements of the array coil system.

11. An MR device, comprising:

a magnetic field device for generating a uniform, steady magnetic field in an examination zone, an RF system for generating magnetic RF pulses in the examination zone, a reference coil system for receiving MR signals from an object present in the examination zone, and a processing unit for forming MR images from the image data, derived from the MR signals of coil elements of a coil array system, while taking into account reference data derived from the MR signals of the reference coil system, wherein the reference coil system includes at least four coil elements which are mutually offset and grouped around the examination zone in a cross-section perpendicular to the direction of the uniform, steady magnetic field, and the coil elements of the reference coil system have dimensions and a construction such that only insignificant inductive coupling occurs between the coil array system and the reference coil system, and wherein the coil elements of the reference coil system are uniformly distributed on the surface of a cylinder whose axis extends parallel to the direction of the main magnetic field.

12. A reference coil system for use in an MR device having a coil array system comprising a plurality of coil elements for receiving MR image signals from an object present in an MR examination zone, the reference coil system comprising:

at least four coil elements which are mutually offset and grouped around the examination zone in a cross-section perpendicular to the direction of the uniform, steady magnetic field, wherein the coil elements of the reference coil system have number, dimensions, and construction such that only slight inductive coupling occurs between the coil array system and the reference coil system, and wherein the reference coil system receives MR reference signals from the object, and a receiving and processing unit for forming an MR image by (i) deriving image data from the MR image signals of coil elements of the coil array system, (ii) deriving reference data from the MR reference signals from the reference coil system, (iii) correcting the derived image data by the derived reference data so that location-dependent sensitivity of the coil elements of the array coil system does not affect image quality, and (iv) deriving the MR image from the corrected image data.

* * * * *